US006979772B2

(12) United States Patent
Meng-Cheng et al.

(10) Patent No.: US 6,979,772 B2
(45) Date of Patent: Dec. 27, 2005

(54) INTEGRATED HEAT DISSIPATING ENCLOSURE FOR ELECTRONIC PRODUCT

(75) Inventors: Huang Meng-Cheng, Taipei (TW); Lin Ming-Yang, Taipei (TW)

(73) Assignee: Chaun-Choung Technology Corp., Sanchung (TW)

( * ) Notice: Subject to any disclaimer, the term of this patent is extended or adjusted under 35 U.S.C. 154(b) by 286 days.

(21) Appl. No.: 10/437,008

(22) Filed: May 14, 2003

(65) Prior Publication Data

US 2005/0126806 A1   Jun. 16, 2005

(51) Int. Cl.[7] .............................. H05K 5/00; H05K 7/20
(52) U.S. Cl. ............................... 174/17 VA; 174/15.1; 174/50; 361/676; 361/688; 361/687
(58) Field of Search ................................ 174/50, 17 R, 174/15.1, 15.2, 17 VA; 361/698, 688, 699, 361/700, 715, 687, 703, 704, 707, 831, 689, 361/676, 677, 678, 690, 696, 697, 702, 709, 361/711; 257/722; 165/80.4

(56) References Cited

U.S. PATENT DOCUMENTS

| 5,440,450 | A | * | 8/1995 | Lau et al. ................... 361/695 |
| 5,926,370 | A | * | 7/1999 | Cromwell ................... 361/700 |
| 6,028,769 | A | * | 2/2000 | Zurek ......................... 361/704 |
| 6,084,178 | A | * | 7/2000 | Cromwell ................. 174/35 R |
| 6,088,223 | A | * | 7/2000 | Diemunsch ................. 361/690 |
| 6,137,682 | A | * | 10/2000 | Ishimine et al. ............ 361/704 |
| 6,201,700 | B1 | * | 3/2001 | Tzinares et al. ............ 361/719 |
| 6,493,223 | B1 | * | 12/2002 | Viswanath et al. ......... 361/690 |
| 6,504,719 | B2 | * | 1/2003 | Konstad et al. ............. 361/698 |
| 2002/0054481 | A1 | * | 5/2002 | Gustine et al. | |
| 2002/0056908 | A1 | * | 5/2002 | Brownell et al. | |

\* cited by examiner

Primary Examiner—Angel R. Estrada (57) ABSTRACT

An integrated heat dissipating enclosure to provide heat dissipation for computer, power supply or other electronic products such as an integrated circuit on a motherboard, a central processing unit, or a chip on a video adapter. The enclosure has a frame and a cooling cover. The frame is used to carry various internal components or peripherals of a computer. The cooling cover has a plurality of fins spaced from each other by a space. The fins are connected together by a thermal conductive pipe to form an integrated heat dissipating enclosure.

4 Claims, 8 Drawing Sheets

FIG. 8

INTEGRATED HEAT DISSIPATING ENCLOSURE FOR ELECTRONIC PRODUCT

BACKGROUND OF THE INVENTION

The present invention relates generally to an integrated heat dissipation enclosure for electronic products and, more particularly, to a cooler providing heat dissipation path for computer, power supply, or other heat generating devices such as an integrated circuit (IC) on a motherboard, a central processing unit (CPU), or a chip on a video adapter.

The highly developed science and technology has continuously increased the execution speed of a chip. The higher execution speed of the chip consequently generates more heat, and increases the temperature of the chip. To effectively dissipate heat generated by the chip devices in an enclosure, so as to maintain the operation temperature of the heat generating devices therein, various kinds of heat dissipation structures have been developed.

The conventional heat dissipation structure uses large area heat sink and heat dissipating fins attached to surfaces of heat generating devices, such as the integrated circuit on a motherboard, central processing unit and chip of a video adapter. Currently, as most of the computer enclosures provide a close space for accommodation devices and peripherals, the heat generated by the heat generating devices cannot be easily dissipated to the external, and a greenhouse effect tends to occur. Therefore, while using a personal computer, some user will remove the enclosure to avoid heat being accumulated in the computer enclosure. However, in such manner, though heat circulation is improved, the internal devices are vulnerable for being exposed to any external structure of force.

It is known that the faster the execution speed of the computer is, the more heat is generated thereby. The computer enclosures available in the market provide nearly close spaces for the computers, so that the heat dissipation effect has to be improved.

BRIEF SUMMARY OF THE INVENTION

The present invention provides an integrated heat dissipating enclosure for electronic products. A plurality of fins spaced from each other is mounted to a frame of an electronic product. As the fins are spaced from each other, the heat generated by each heat generating device can be circulated towards the external via the spaces between the fins. Therefore, the greenhouse effect is prevented.

In one embodiment of the present invention, the integrated heat dissipating enclosure for an electronic product provided by the present invention comprises a frame and a cooling cover. The frame is used to carry a plurality of devices and peripherals of the electronic product therein. The cooling cover is mounted over the frame and includes a plurality spaced fins, which are connected to each other by at least one thermal conductive pipe. Preferably, the fins are aligned with each other and arranged between a front end to a rear end of the frame, and the thermal conductive pipe extends laterally through the fins. Alternatively, the cooling cover further comprises a top heat sink panel, the fins laterally extend from two elongate sides of top heat sink panel, and the thermal pipe extend longitudinal through the fins. The thermal conductive pipe includes a heat conducting pipe or a cooling pipe. In one embodiment, the thermal conductive pipe further includes an extension in connection with an internal heat dissipation structure of the electronic product. Therefore, the heat absorbed by the internal heat dissipation structure can be easily and quickly transferred to the external. The enclosure may further comprise a pump for introducing a cooling liquid into the thermal conductive pipe to form a circulation circuit.

In another embodiment, the present invention provides an integrated heat dissipating enclosure for an electronic product comprising a frame, a cover cooling and an external cover. The frame is used to carry a plurality of devices and peripherals of the electronic product therein. The cooling cover is mounted over the frame and includes a plurality spaced fins, which are connected to each other by at least one thermal conductive pipe. The external cover covers the cooling cover.

The fins are aligned with each other and arrange between a front end to a rear end of the frame, and the thermal conductive pipe extends laterally through the fins. Alternatively, the cooling cover further comprises a top heat sink panel having two elongate sides, from which the fins laterally extend, and the thermal conductive pipe extending longitudinally through the fins. The thermal conductive pipe includes a heat conducting pipe or a cooling pipe. The thermal conductive pipe may extend over the cooling cover to connect an internal heat dissipation structure of the electronic product. Similarly, a pump for introducing a cooling liquid into the thermal conductive pipe may be included to form a circulation loop. The external cover includes a plurality of elongate open channels. The elongate open channels are aligned with the spaces between the fins. Preferably, the external cover is made of power metallurgy or bubble aluminum to include a porous structure.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
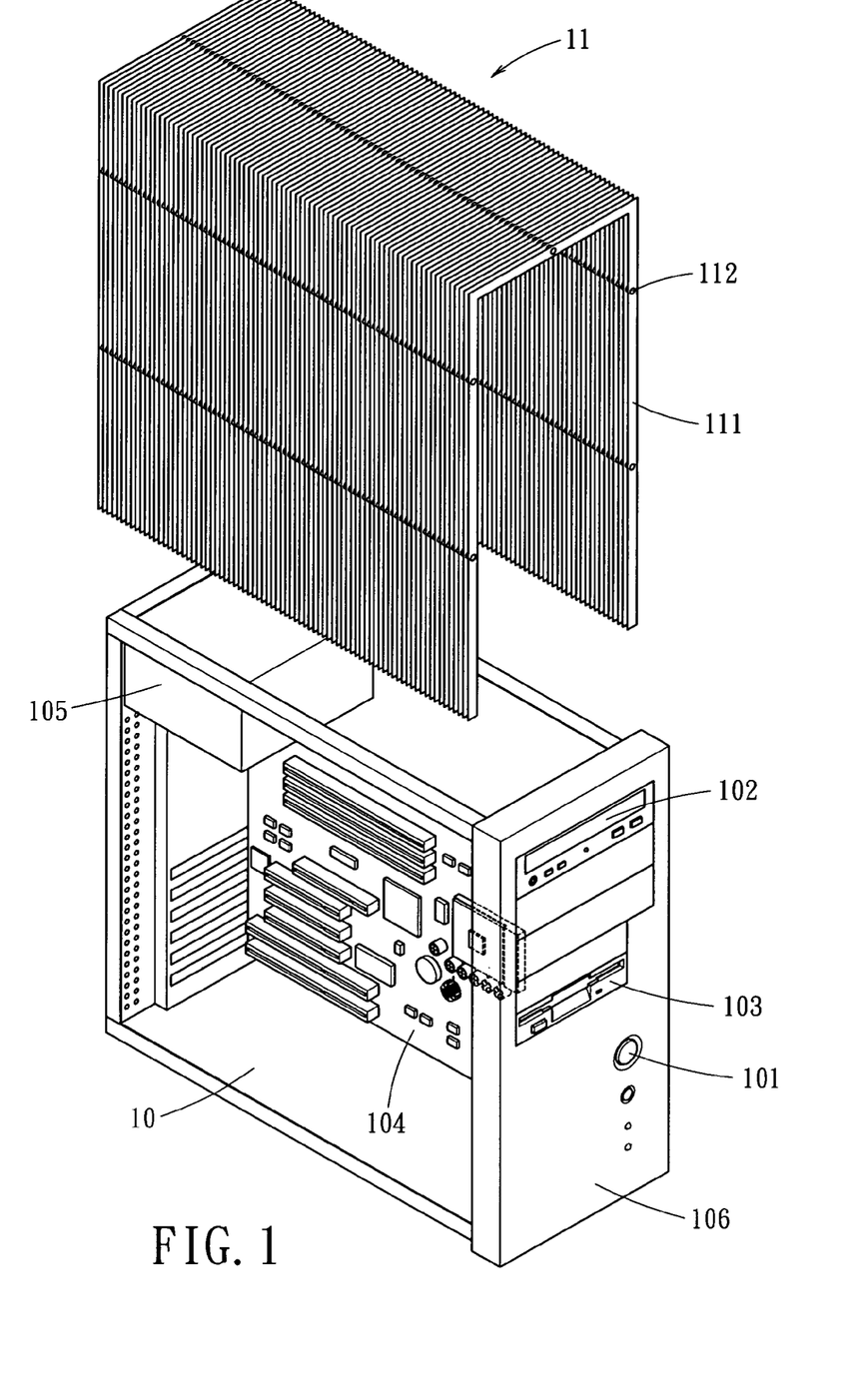
FIG. 1 shows an exploded view of the enclosure provided in a first embodiment of the present invention.

As shown in FIG. 1, the present invention provides an integrated heat dissipating enclosure for dissipating heat generated by heating generating devices in an electronic product. The heat generating devices include integrated circuits on a motherboard, a central processing unit or a chip on a video adapter, for example. The enclosure comprises a frame 10 and a cooling cover 11 to be mounted to the frame 10.

The frame 10 is used to carry and accommodate various devices or peripherals built in the electronic product. The frame 10 comprises a front panel 106, on which a power switch button 101 is formed, and through which peripherals such as compact disk drive 102 and floppy disk drive 103 can be installed and accessed. Central processing unit, memory and other components for executing computer operation are installed on a motherboard 104. As the assembly of the components or devices is not essential to the present invention, a detailed introduction is omitted.

Figure 2:
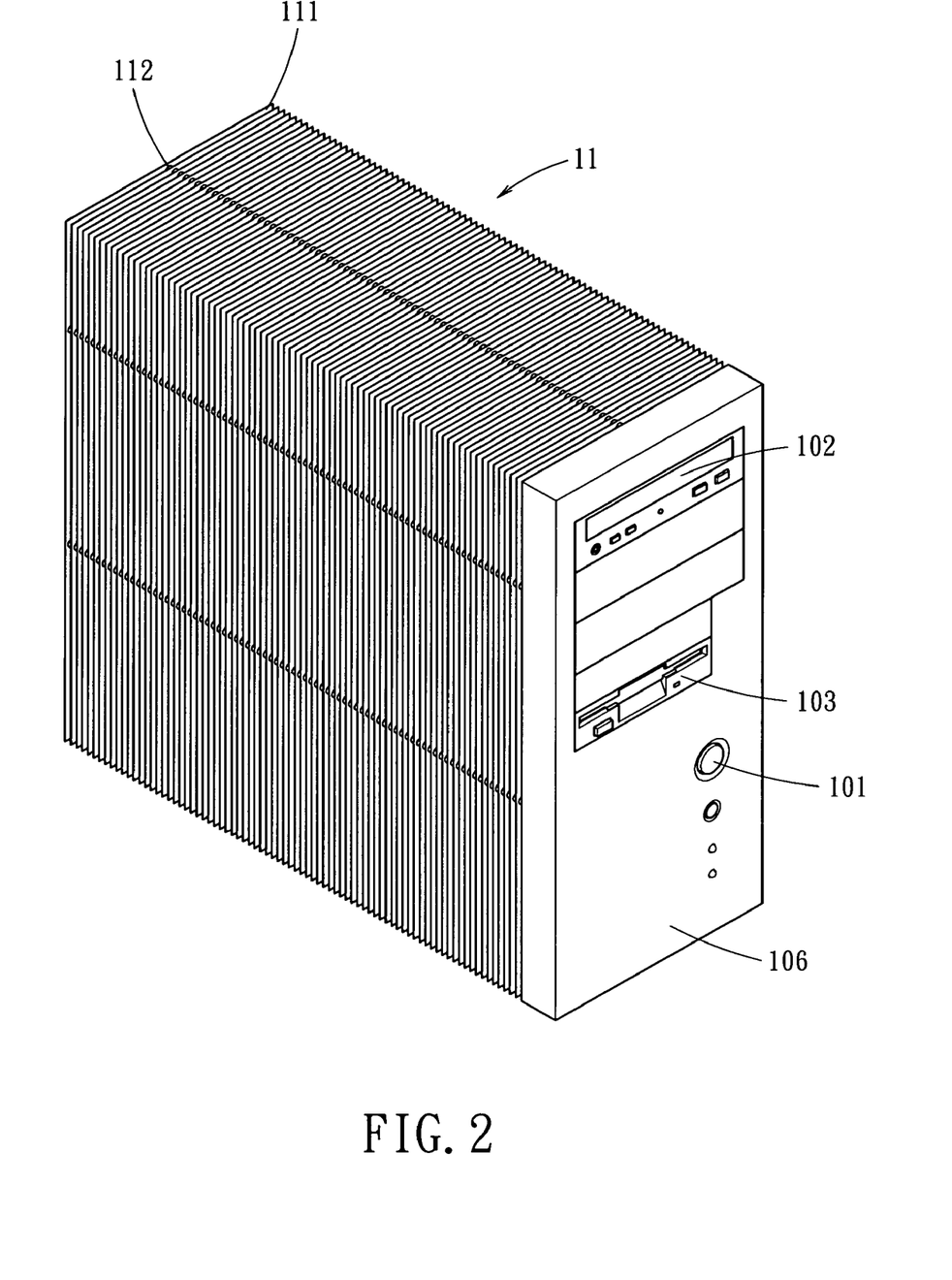
FIG. 2 shows a perspective view of the enclosure provided in the first embodiment of the present invention.

Referring to FIG. 2, the cooling cover 11 includes closely aligned and spaced fins 111. As spaces are reserved between neighboring fins 111, heat generated by the heat generating devices in the electronic product can be circulated to the external.

The fins 111 an "n"-shape or arc-shape cross section. The fins 111 are aligned to each other and arranged between a front end and a rear end of the frame 10. The fins 111 are connected together by a thermal conductive pipe 112 (heating pipe or cooling pipe). As shown, the thermal conductive pipe 112 extends laterally through each of the fins 111 to integrate the fins 111 into the cooling cover 11.

Thereby, an integrated heat dissipating enclosure of an electronic product is provided.

Figure 3:
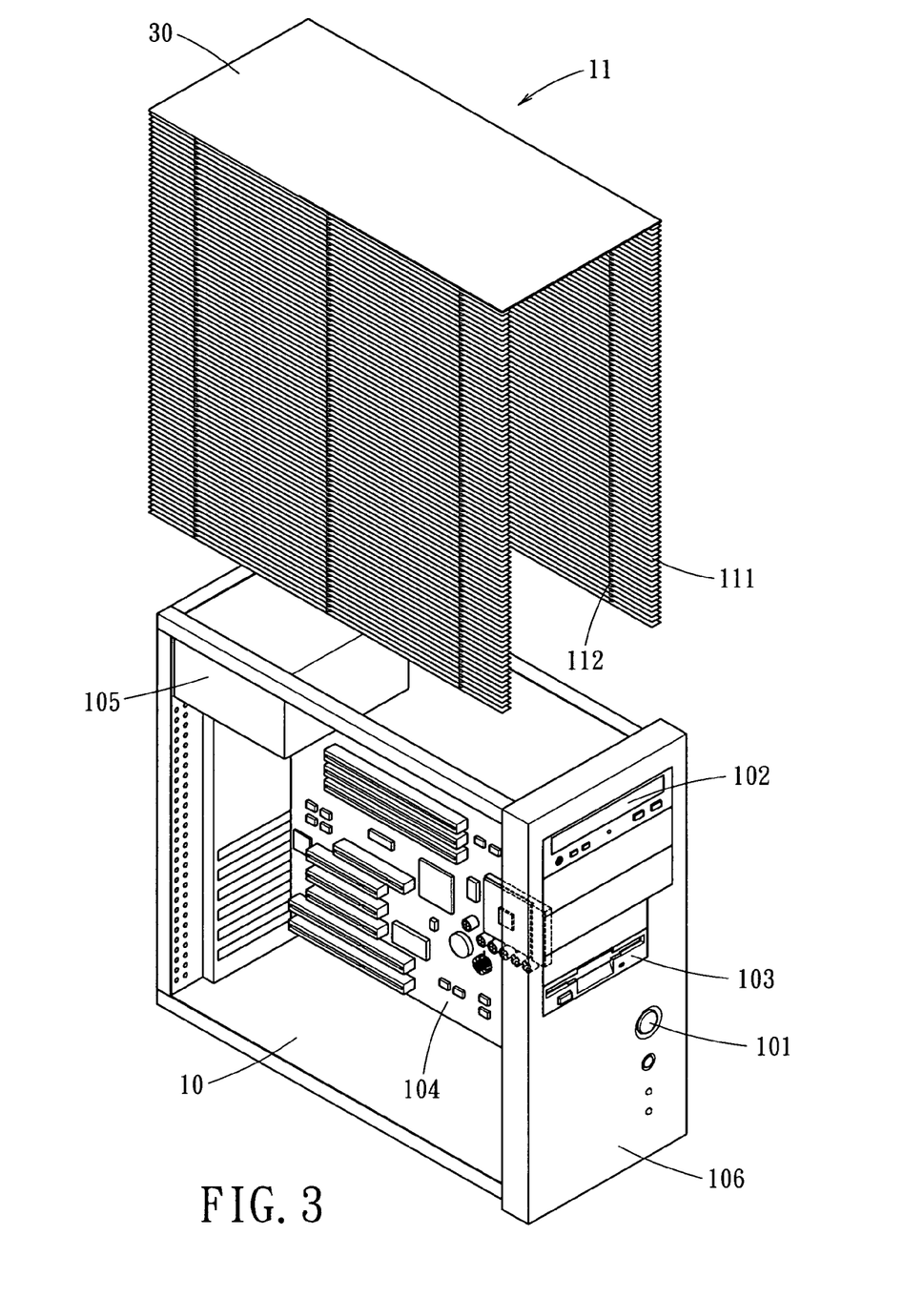
FIG. 3 shows an exploded view of the enclosure provided in a second embodiment of the present invention.
Figure 4:
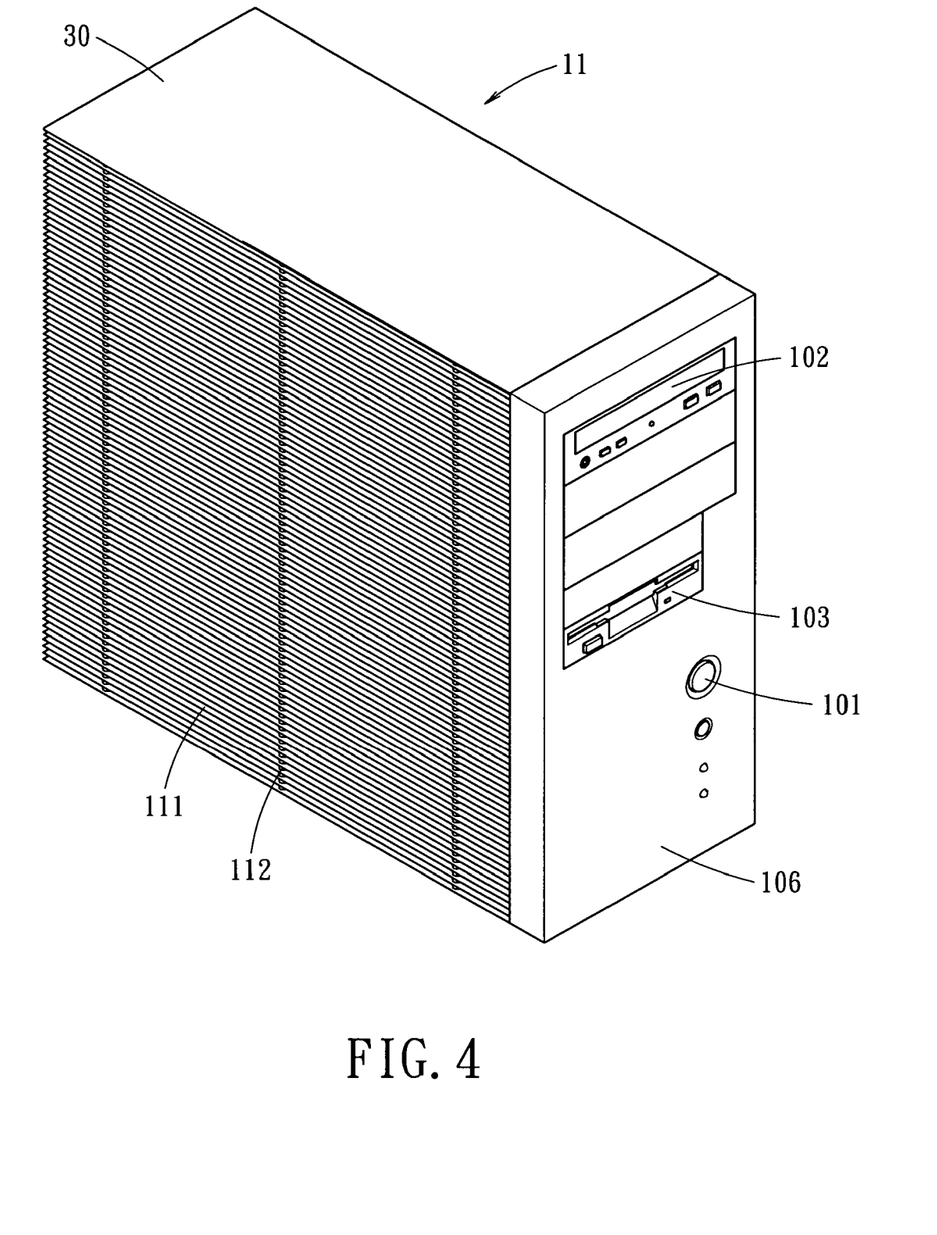
FIG. 4 shows a perspective view of the enclosure provided in the second embodiment of the present invention.

Referring to FIGS. 3 and 4, the exploded view and the perspective view of a second embodiment of an integrated heat dissipating enclosure for an electronic product are shown. The cooling cover 11 includes a top heat sink panel 30, and a plurality of laterally extending fins 111 aligned with each other are arranged from two opposing elongate sides of the top heat sink panel 30. Therefore, an inverse U-shape space is formed allowing the frame 10 and the electronic product enclosed thereby to slide through. Similarly, thermal conductive pipes 112 penetrating through the fins 111 are used to integrate the fins 111 and the top heat sink panel 30. In this embodiment, the thermal conductive pipes 112 extend longitudinally through the fins 111 extending from each elongate side of the top heat sink panel 30. The integrated cooling cover 11 is then mounted to the frame 10 to form the integrated enclosure of the electronic product.

Figure 5:
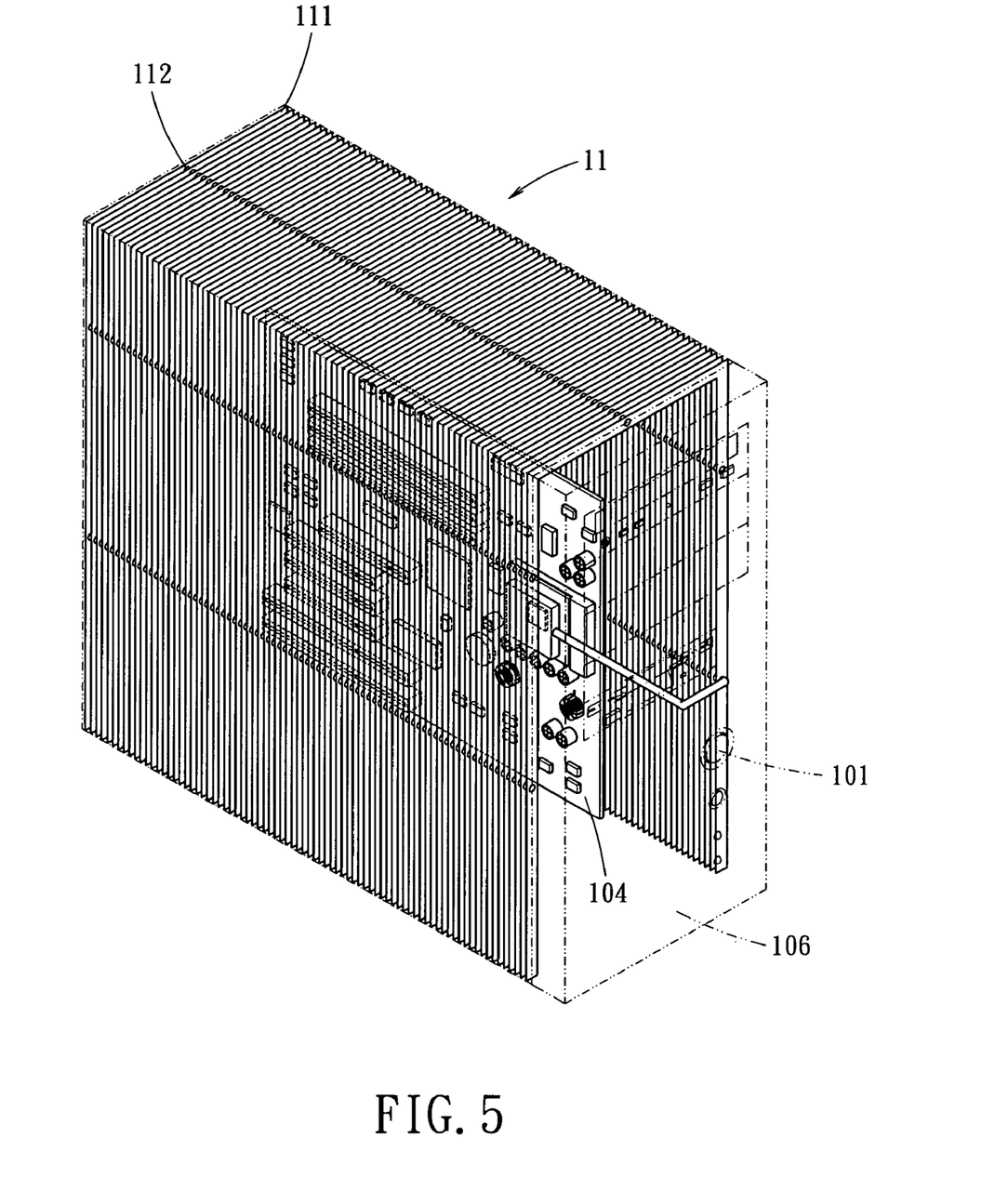
FIG. 5 shows an exploded view of the enclosure provided in a third embodiment of the present invention.

FIG. 5 shows a perspective view of a third embodiment of the present invention. The third embodiment as shown is fabricated by modifying the enclosure provided as the first embodiment as shown in FIGS. 1 and 2. In this embodiment, the thermal conductive pipe 112 laterally extending through the fins 111 has an extension in connection with the thermal conductive block or heat sink of the central processing unit of the electronic product. Therefore, the heat generated by the central processing unit, after being absorbed by the thermal conductive block or heat sink thereof, is quickly dissipated to the external via the thermal conductive pipe 12 and the fins 111.

Figure 6:
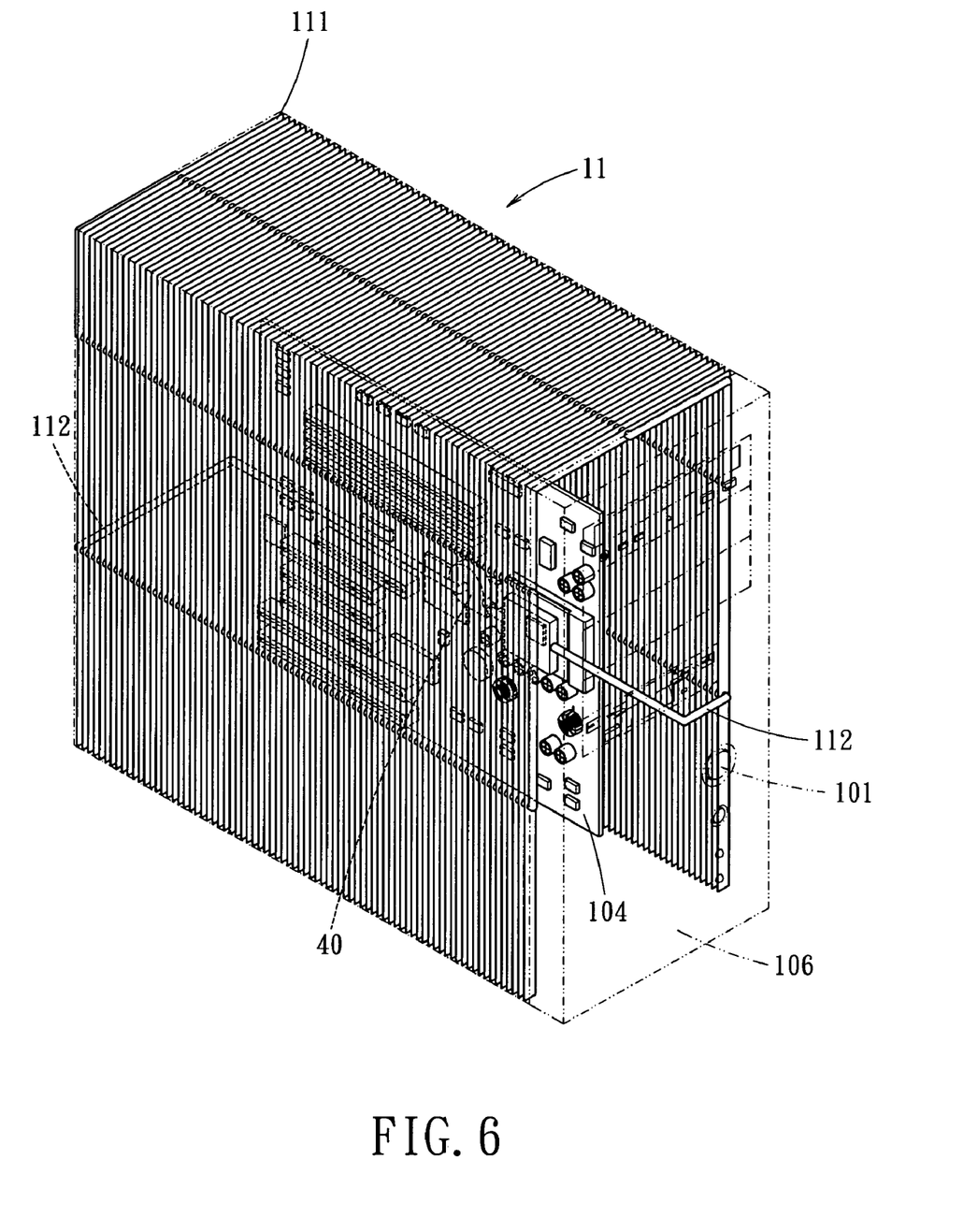
FIG. 6 shows a perspective view of the enclosure provided in the third embodiment of the present invention.

As shown in FIG. 6, cooling liquid such as water, methanol, or cooling agent can be introduced into the thermal conductive pipe 112 to form a circulating circuit. A pump 40 may further be implemented to perform internal circulation of the circulating circuit, such that the thermal dissipation effect is further enhanced.

Figure 7:
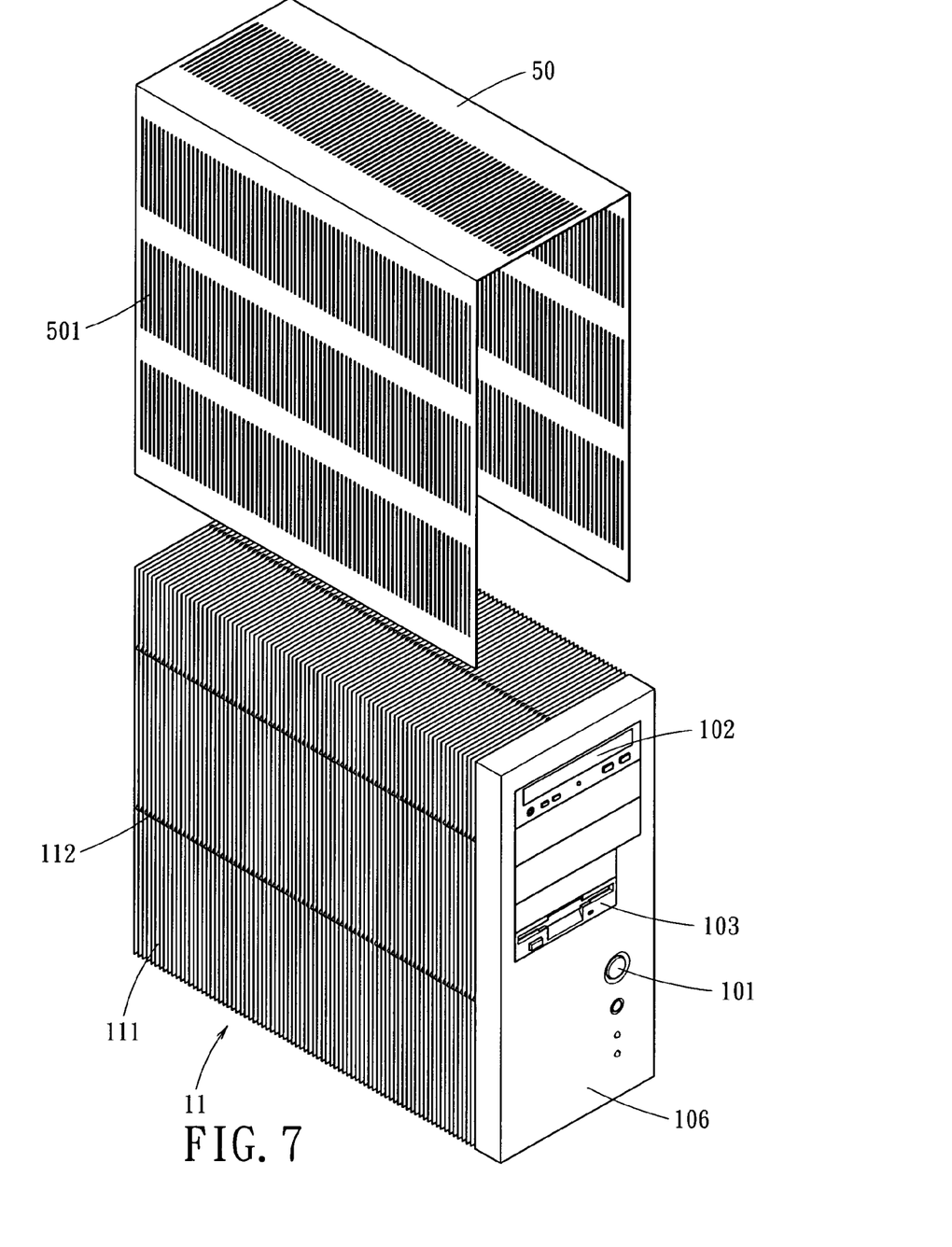
FIG. 7 shows an exploded view of the enclosure provided in a fourth embodiment of the present invention.
Figure 8:
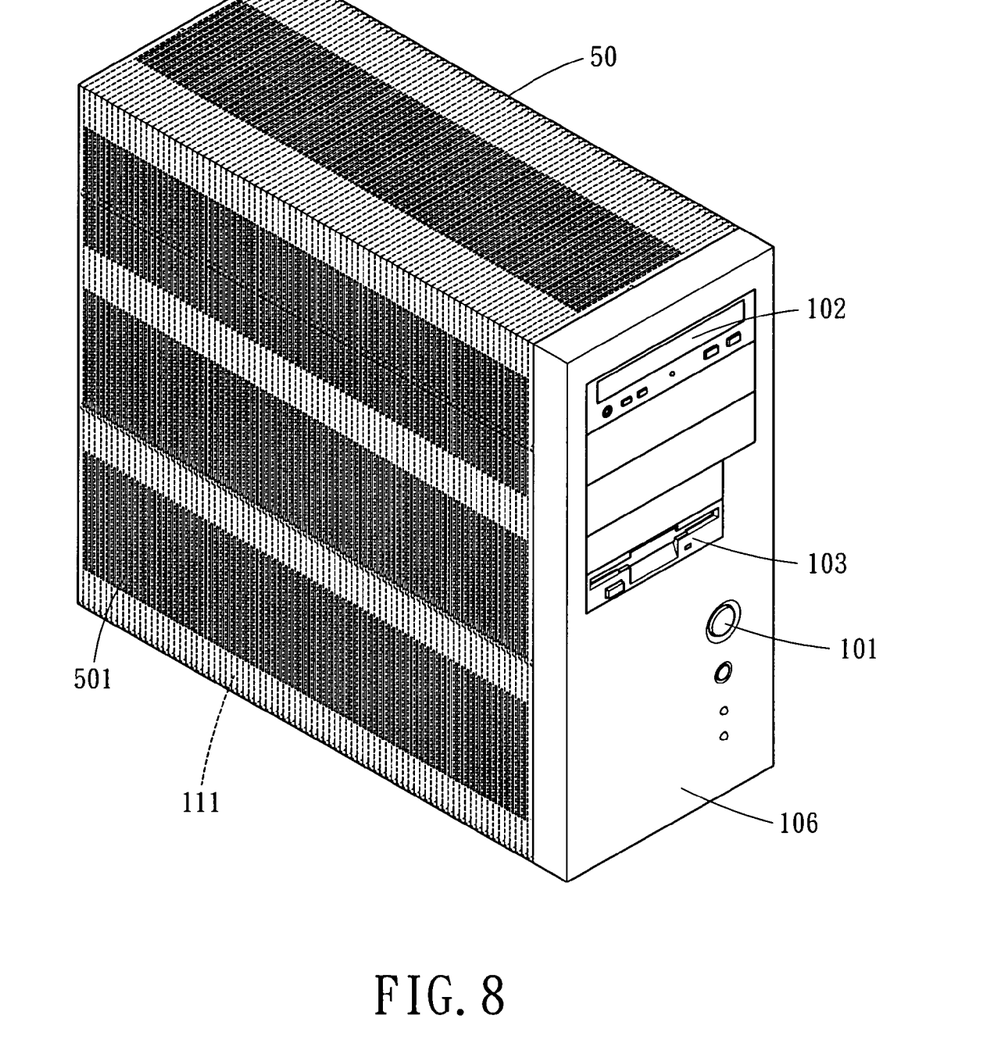
FIG. 8 shows a perspective view of the enclosure provided in the fourth embodiment of the present invention.

FIGS. 7 and 8 show a fourth embodiment of the present invention. In this embodiment, an external cover 50 may be included to cover the cooling cover 11. The external cover 50 includes a plurality of elongate openings 501 to be aligned with spaces between the fins 111. Therefore, the protection of the internal devices of the electronic product can be reinforced, while the air circulation is maintained. In addition, by the protection of the external cover 50, the fins 111 are prevented from being deformed by external force or impact, particularly during transportation.

The external cover 50 may be made by using power metallurgy or bubble aluminum material to form a porous structure, so as to provide fine venting channels for air circulation.

The integrated heat dissipating enclosure for electronic products has at least the following advantages.

1. Through the spaces between the fins 111 of the cooling cover 11, the internal of the electronic product is in communication with the external ambient, such that the heat generated by internal heat generating devices of the electronic product can be effectively conducted to the external to avoid greenhouse effect.

2. The thermal conductive pipe 112 for connecting the fins can extend towards the built-in heat dissipation structures of the internal devices. The heat dissipation effect of the heat generating devices is further improved.

3. The thermal conductive pipe 112 may provide a liquid circulation circuit, such that the heat dissipation effect is superior to those conventional structure made of aluminum or copper.

4. The external cover 50 provides additional protection upon the internal devices and the fins 111 of the cooling cover 11. Therefore, the fins 111 are prevented from being deformed due to external force. Dust is prevented from entering the electronic product. The protection is most significant during transportation of the electronic product.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An integrated heat dissipating enclosure for an electronic product, comprising:
    a frame, to carry a plurality of devices and peripherals of the electronic product therein; and
    a cooling cover mounted over the frame and including a plurality spaced fins, wherein the fins are connected to each other by at least one thermal conductive pipe,
    wherein the cooling cover further comprises a top heat sink panel, the fins laterally extend from two elongate sides of top heat sink panel, and the thermal pipe extend longitudinal through the fins.

2. The enclosure of claim 1, further comprising a pump for introducing a cooling liquid into the thermal conductive pipe to form a circulation circuit.

3. An integrated heat dissipating enclosure for an electronic product, comprising:
    a frame, to carry a plurality of devices and peripherals of the electronic product therein;
    a cooling cover, mounted over the frame and including a plurality spaced fins, wherein the fins are connected to each other by at least one thermal conductive pipe; and
    an external cover, covering the cooling cover,
    wherein the cooling cover further comprises a top heat sink panel having two elongate sides, from which the fins laterally extend, and the thermal conductive pipe extending longitudinally through the fins.

4. The enclosure of claim 3, further comprising a pump for introducing a cooling liquid into the thermal conductive pipe to form a circulation circuit.

* * * * *